(12) United States Patent
Chen

(10) Patent No.: US 9,379,073 B2
(45) Date of Patent: *Jun. 28, 2016

(54) MULTI-LAYER PAD RING FOR INTEGRATED CIRCUIT

(71) Applicant: HGST Technologies Santa Ana, Inc., Santa Ana, CA (US)

(72) Inventor: Tsan Lin Chen, Zhubei (TW)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/657,780

(22) Filed: Mar. 13, 2015

(65) Prior Publication Data

US 2015/0187712 A1 Jul. 2, 2015

Related U.S. Application Data

(63) Continuation of application No. 13/714,590, filed on Dec. 14, 2012, now Pat. No. 8,994,133.

(60) Provisional application No. 61/577,913, filed on Dec. 20, 2011.

(51) Int. Cl.
| | |
|---|---|
| *H01L 31/0203* | (2014.01) |
| *H01L 23/00* | (2006.01) |
| *G06F 12/02* | (2006.01) |
| *H01L 27/02* | (2006.01) |
| *G06F 13/16* | (2006.01) |

(52) U.S. Cl.
CPC ............ *H01L 24/09* (2013.01); *G06F 12/0246* (2013.01); *G06F 13/16* (2013.01); *H01L 24/06* (2013.01); *H01L 27/0292* (2013.01); *H01L 2224/06135* (2013.01); *H01L 2224/0914* (2013.01); *H01L 2224/09515* (2013.01)

(58) Field of Classification Search
CPC ...................................................... H01L 31/0203
USPC .................................. 257/431–448, 730, 773
See application file for complete search history.

(56) References Cited

U.S. PATENT DOCUMENTS

| | | | |
|---|---|---|---|
| 5,814,892 A | 9/1998 | Steidl et al. | |
| 7,822,887 B2 | 10/2010 | Torabi et al. | |
| 8,492,886 B2 | 7/2013 | Or-Bach et al. | |
| 8,994,133 B2 * | 3/2015 | Chen ............................ | 257/433 |

OTHER PUBLICATIONS

No Author Listed, Chapter 16, "Portions from Application-Specific Integrated Circuits," by Addison Wesley Longman, Inc. 16 pages (1987).
No Author Listed, "Semiconductor Packaging Assembly Technology," National Semiconductor, 8 pages (Aug. 1999).

* cited by examiner

*Primary Examiner* — Cuong Q Nguyen
(74) *Attorney, Agent, or Firm* — Wilmer Cutler Pickering Hale and Dorr LLP

(57) ABSTRACT

Some embodiments of the disclosed subject matter include an integrated circuit. The integrated circuit includes a solid state device controller configured to control a plurality of flash memory devices, a first set of input output IO pads, coupled to the solid state device controller, arranged as a first pad ring around a perimeter of the integrated circuit, and a second set of IO pads arranged adjacent to at least one side of the first pad ring, wherein one of the second set of IO pads includes a power source node configured to receive a power supply voltage for the solid state device controller, a ground node, and a bond pad configured to receive an external signal.

20 Claims, 11 Drawing Sheets

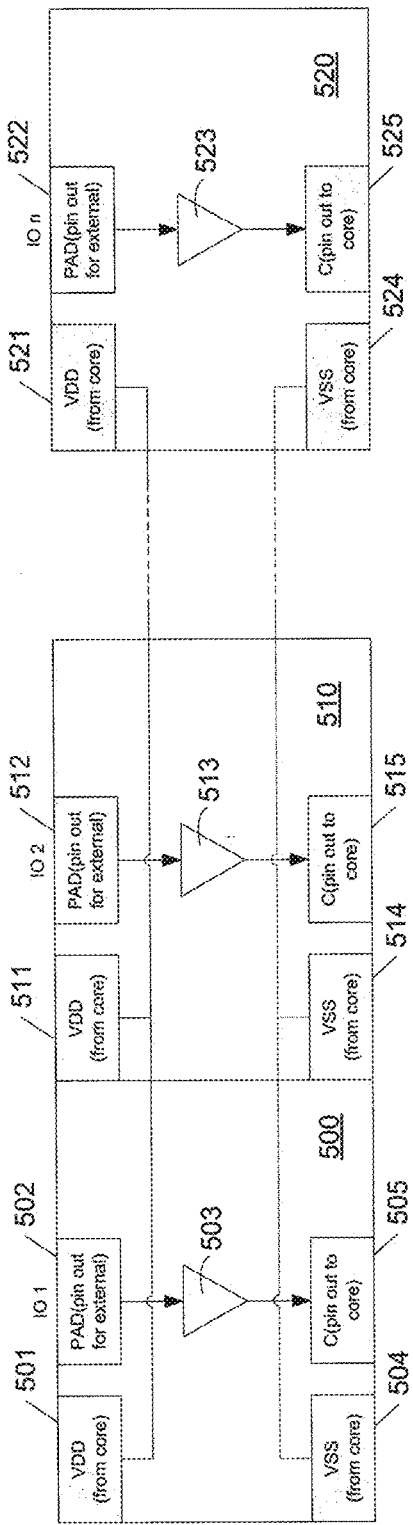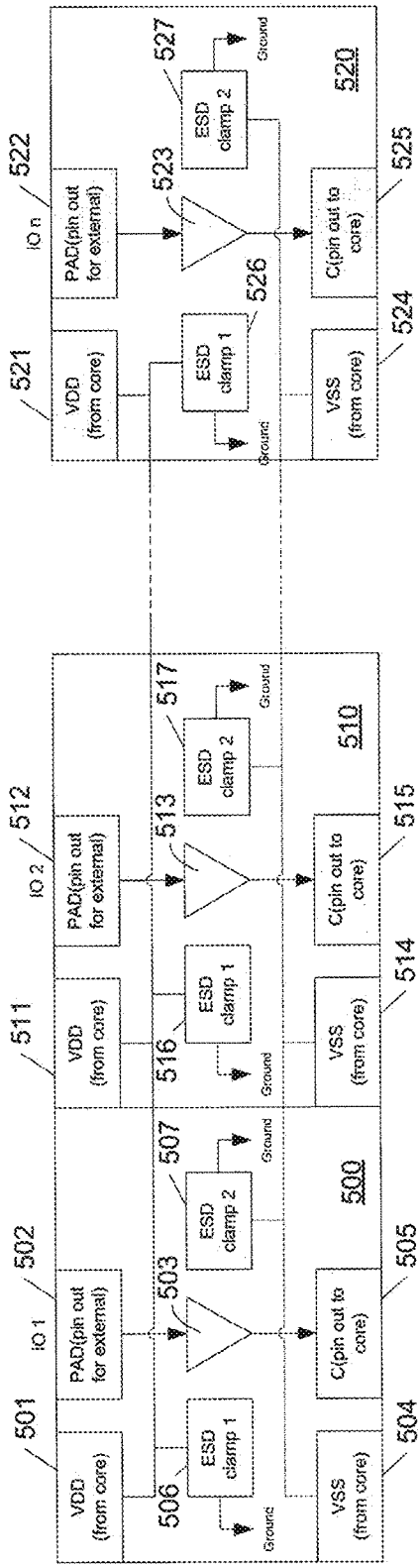

US 9,379,073 B2

MULTI-LAYER PAD RING FOR INTEGRATED CIRCUIT

CROSS-REFERENCE TO RELATED APPLICATION

This application is a continuation application of U.S. patent application Ser. No. 13/714,590, entitled "Multi-layer Input/Output Pad Ring for Solid State Device Controller," filed on Dec. 14, 2012, which claims benefit of U.S. Provisional Patent Application No. 61/577,913, entitled "Multi-layer IO Ring Implementation for NAND Flash Solid State Storage Device Controller," filed on Dec. 20, 2011, each of which is expressly hereby incorporated by reference herein in its entirety.

TECHNICAL FIELD

The disclosed subject matter relates generally to a multi-layer input/output ring for a solid state device controller.

BACKGROUND

A solid state device (SSD) controller interfaces with a flash device to read from and write to the flash device. A conventional solid state device (SSD) controller is often pad-limited. Flash devices, such as NAND flash (N-Flash) devices, have a large number of pin outs, and thus the SSD controller chip also requires a large number of pin outs to communicate with the flash devices. This large number of pin outs, and thus the large number of IO pads, can render the chip pad-limited. This problem is exacerbated when the SSD controller is configured to interface with a plurality of flash devices in parallel.

The pad-limitedness nature of a chip can be partially addressed using a staggered bond pad technology, which is shown in FIG. 1. This technology hinges on an observation that the bonding area (a metal strip that interfaces with an external bond wire) is often larger than the underlying pad body. The staggered bond pad technology fits more input output (IO) pads around a single perimeter ring by separating the bonding area and the IO pad body, and staggering the bonding area. FIG. 1 illustrates the staggered bond pad technology. FIG. 1 shows the IO pad bodies 10A-10D and the bonding areas 12A-12D. The bonding areas 12A-12D are decoupled from the corresponding pad bodies 10A-10D. While the staggered bond pad technology can be effective for fitting more pad bodies around the ring, this technology can be ineffective when the pad bodies themselves are large or when there is a large number of IO pads.

SUMMARY

Some embodiments of the present disclosure illustrate a multi-layer IO ring for N-Flash SSD controllers. The multi-layer IO ring for N-Flash SSD controllers can reduce unused die space within SSD controller by using otherwise unused die space for additional IO pads. This way, the overall size of the die can be reduced while still maintaining an appropriate number of pads to communicate with a plurality of N-Flash devices.

Some embodiments of the present disclosure show an integrated circuit. The integrated circuit can include a solid state device controller configured to control a plurality of flash memory devices, a first set of input output IO pads, coupled to the solid state device controller, arranged as a first pad ring around a perimeter of the integrated circuit, and a second set of IO pads arranged adjacent to at least one side of the first pad ring. The one of the second set of IO pads can include a power source node configured to receive a power supply voltage for the solid state device controller, a ground node, and a bond pad configured to receive an external signal.

Some embodiments of the present disclosure show a solid state device. The solid state device can include a plurality of NAND flash memory devices and an integrated circuit. The integrated circuit can include a solid state device controller configured to control a plurality of flash memory devices, a first set of input output IO pads, coupled to the solid state device controller, arranged as a first pad ring around a perimeter of the integrated circuit, and a second set of IO pads arranged adjacent to at least one side of the first pad ring. The one of the second set of IO pads can include a power source node configured to receive a power supply voltage for the solid state device controller, a ground node, and a bond pad configured to receive an external signal.

In any of the embodiments described herein, the second set of IO pads are arranged as a second pad ring concentric with the first pad ring, and wherein an area encompassed by the second pad ring is smaller than an area encompassed by the first pad ring.

In any of the embodiments described herein, each of the first set of IO pads includes a power source node and a ground node.

In any of the embodiments described herein, the ground node of one of the first set of IO pads is electrically coupled to the ground node of every other IO pads in the first set.

In any of the embodiments described herein, each of the second set of IO pads includes a power source node and a ground node.

In any of the embodiments described herein, the ground node of one of the second set of IO pads is electrically coupled to the ground node of every other IO pads in the second set.

In any of the embodiments described herein, the ground node of one of the first set of IO pads is electrically coupled to the ground node of one of the second set of IO pads.

In any of the embodiments described herein, one of the first set of IO pads includes a first electrostatic discharge protection circuit coupled to the power source node and the ground node of the one of the first set of IO pads.

In any of the embodiments described herein, one of the second set of IO pads includes a second electrostatic discharge protection circuit coupled to the power source node and the ground node of the one of the second set of IO pads.

In any of the embodiments described herein, the first electrostatic discharge protection circuit is electrically coupled to the second electrostatic discharge protection circuit.

In any of the embodiments described herein, the first electrostatic discharge protection circuit is electrically decoupled to the second electrostatic discharge protection circuit.

DESCRIPTION OF THE FIGURES

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting.

FIGS. 5A-5B illustrate a schematic of input output (IO) pads in a SSD controller in accordance with some embodiments of the disclosed subject matter.

DETAILED DESCRIPTION

The present disclosure relates to a new pad placement approach for reducing the die size of a SSD controller configured to control a plurality of flash devices. When a multiple layer IO is implemented, it is possible to control and limit the die size for high speed SSD controllers. In some embodiments, each IO pad layer can maintain an independent electrostatic discharge (ESD) group to improve the ESD capability.

Figure 1:
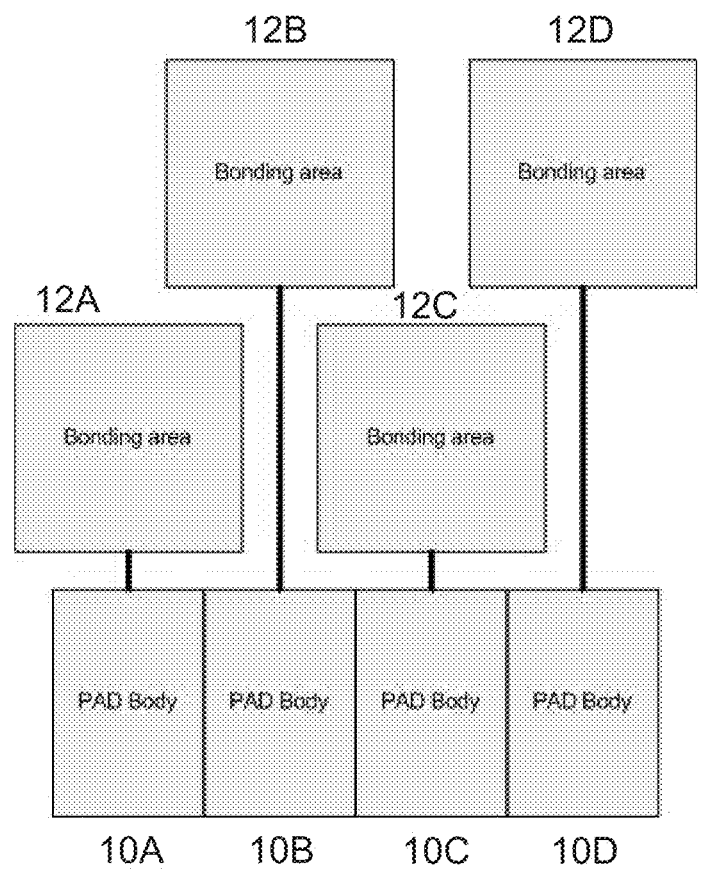
FIG. 1 illustrates a staggered bond pad technology.
Figure 2A:
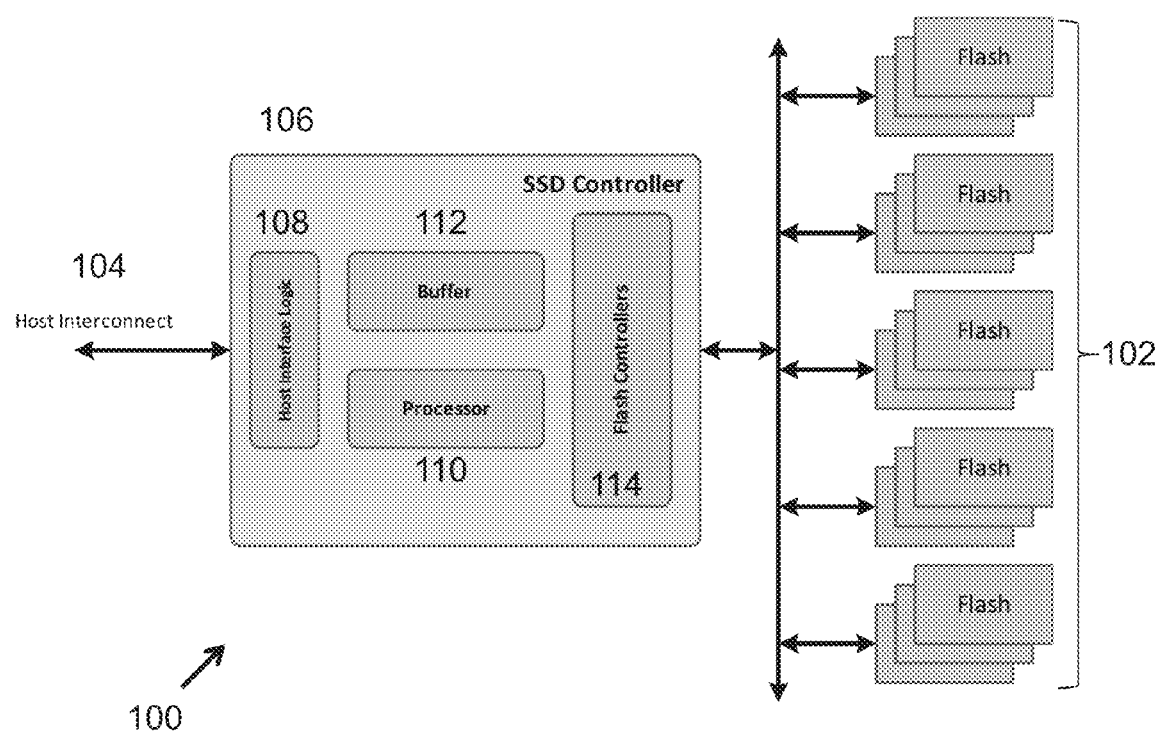
FIG. 2A illustrates a solid state device (SSD) in accordance with some embodiments of the disclosed subject matter.

FIG. 2A illustrates a SSD 100 in accordance with some embodiments of the disclosed subject matter. The operation of the SSD 100 is described in co-owned U.S. Pat. No. 7,822,887 "Multi-channel Solid-State Storage System" issued Oct. 26, 2010, the entire contents of which are incorporated by reference. SSD 100 includes one or more flash devices 102, a host interconnect 104, and an SSD controller 106. The host interconnect 104 connects the SSD 100 to a host device, such as a central processing unit (CPU). Flash devices 102 store data. SSD controller 106 controls the transfer of data from a host to flash devices 102.

SSD controller 106 includes host interface logic 108, a processor 110, a buffer 112, flash controllers 114, and peripherals (e.g., buffer, DMA, DSP, etc.). Host interface logic 108 manages communication between SSD 100 and the host device via host interconnect 104. Processor 110 manages operations of SSD 100 using firmware. Buffer 112 is configured to buffer incoming data before the data are written into one or more flash devices 102. Flash controllers 114 interface with flash devices 102 to control communication with the flash devices. Flash controllers 114 can access flash devices 102 either serially in a time multiplexed manner or in parallel.

Figure 2B:
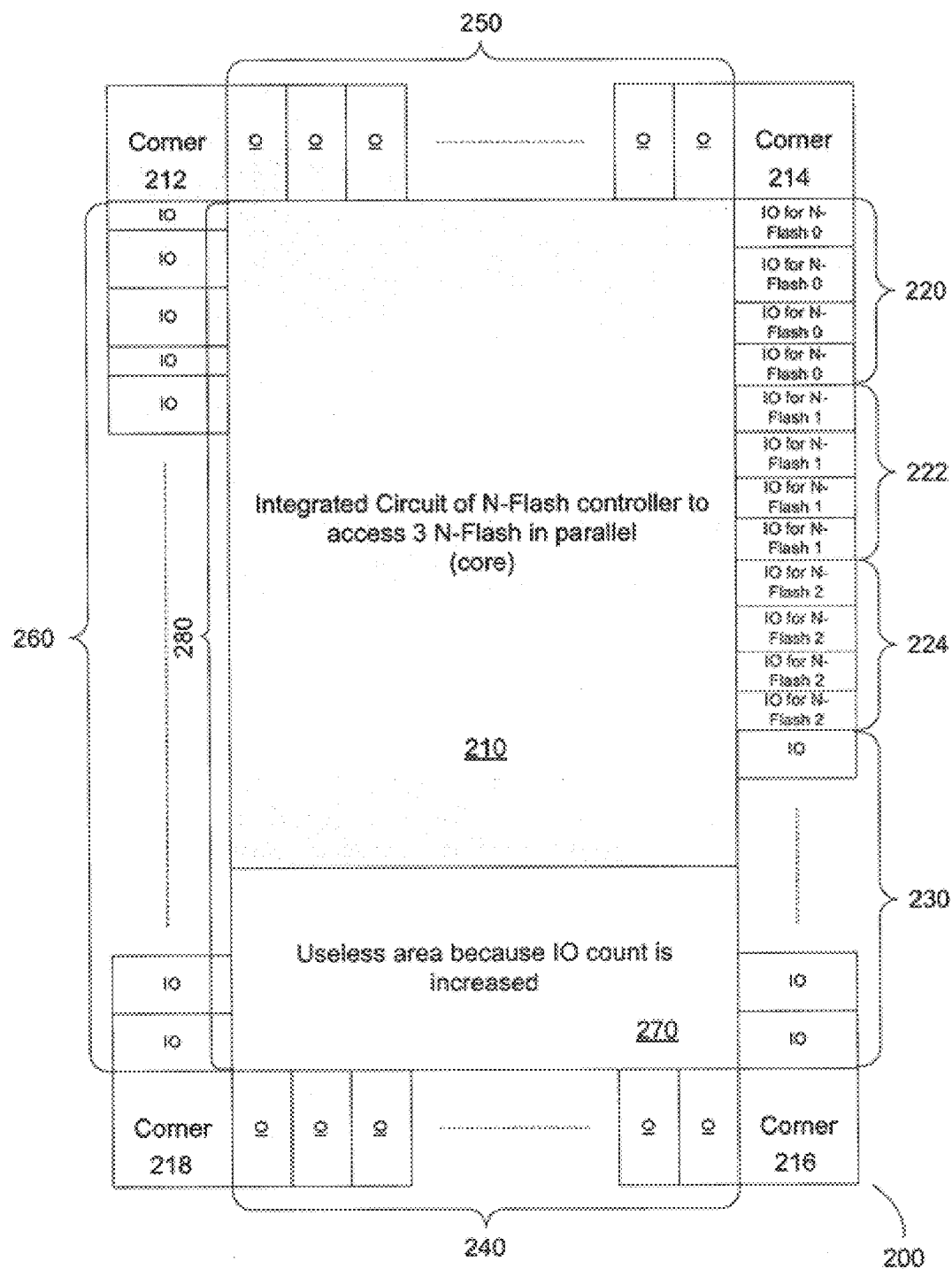
FIG. 2B illustrates a die of a SSD controller in accordance with some embodiments of the disclosed subject matter.

SSD controller 106 can be integrated onto a die. The die can include a silicon die, a sapphire die, or a gallium nitride die. Because SSD controller 106 is configured to interface with multiple N-Flash devices 102, the die for SSD controller 106 can include a large number of IO pads. Accommodating a large number of IO pads on a single die can be challenging. FIG. 2B illustrates a schematic of a die for SSD controller configured to interface with a plurality of N-Flash devices in accordance with some embodiments of the disclosed subject matter. Die 200 includes an integrated circuit 210 that includes SSD controller 106, four corners 212, 214, 216, and 218, a plurality of IO pads 220, 222, 224 for interfacing with a plurality of flash devices (in this example, three flash devices: N-Flash 0, N-Flash 1, and N-Flash 2), and a plurality of additional IO pads 230, 240, 250 and 260 for providing external signals to the core 210. Corners 212, 214, 216, and 218 provide interconnections between IO pads adjacent to the corners 212, 214, 216, and 218. In this embodiment, the IO pads are configured as a ring. A ring is a configuration of electrical elements, for example IO pads, wherein each electrical element is connected directly or indirectly to each other, for example, in a ring configuration. The ring can be in a circular configuration or a rectangular configuration.

In the embodiment illustrated in FIG. 2B, die 200 uses four IO pads to interface with one N-Flash device. In other embodiments, die 200 uses any number of IO pads to connect with one N-Flash device, for example, 1, 2, 3, or up to 10 or more pads. IO pads 220 for N-Flash 0 correspond to the IO pads coupled to the first N-Flash device; IO pads 222 for N-Flash 1 correspond to the IO pads coupled to the second N-Flash device; and IO pads 224 for N-Flash 2 correspond to the IO pads coupled to the third N-Flash device. Because IO pads are on the perimeter of the integrated circuit chip, the IO pads can require die 200 to have a large perimeter. In some cases, to accommodate such large number of IO pads on the perimeter, die 200 may need to be larger than needed to accommodate SSD controller 106. This may result in unused die area 270 adjacent to core 210 that implements SSD controller 106. This unused area 270 can increase the fabrication cost, and thus, the price of die 200.

Figure 3:
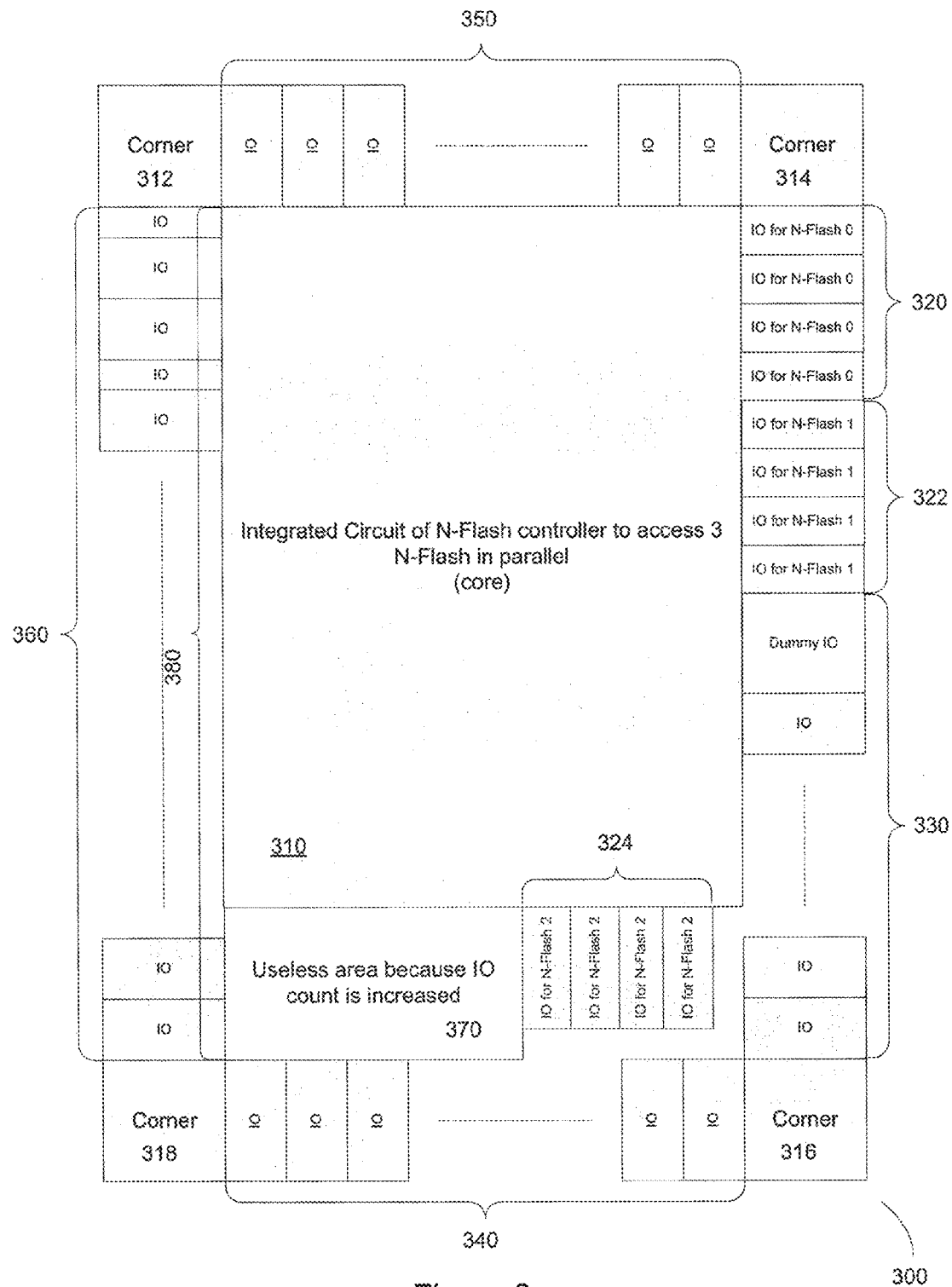
FIG. 3 illustrates a schematic of a die in which input/output pads are arranged as two layers in accordance with some embodiments of the disclosed subject matter.

In some embodiments, the IO pads can be arranged in multiple layers as opposed to a single layer illustrated in FIG. 2B. The multi-layer IO pad structure reduces the required perimeter of the die, thereby reducing the unused area in the die. FIG. 3 illustrates a schematic of a die in which IO pads are arranged as two layers in accordance with some embodiments of the disclosed subject matter. In this embodiment, a portion of the IO ring, corresponding to IO pads 324 and 340, has a two layer arrangement. The die 300 for SSD controller 106 includes a core 310 that includes SSD controller 106, four corners 312, 314, 316, and 318, a plurality of IO pads 320, 322, 324 for interfacing with N-Flash devices, and a plurality of additional IO pads 330, 340, 350 and 360 for providing external signals to the core 310. IO pads 320 for N-Flash 0 correspond to the IO pads coupled to the first N-Flash device; IO pads 322 for N-Flash 1 correspond to the IO pads coupled to the second N-Flash device; and IO pads 324 for N-Flash 2 correspond to the IO pads coupled to the third N-Flash device. In contrast to FIG. 2B, IO pads 324 for N-Flash 2 are arranged within what was the unused area 270 of the configuration shown in FIG. 2B. This creates a two-layer IO structure around core 310, which reduces unused die area 370 and allows use of smaller die 300 for SSD controller 106.

Figure 4:
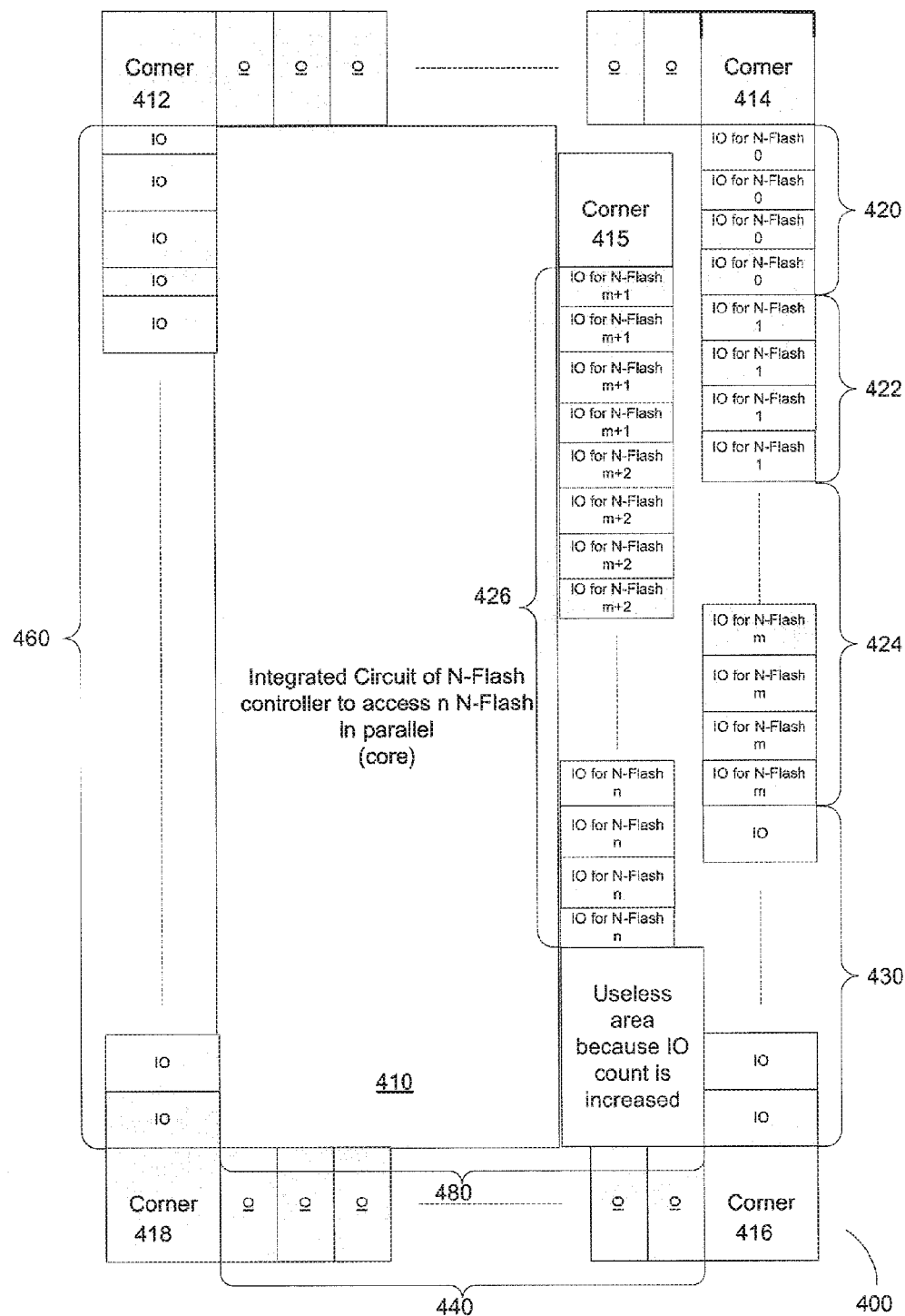
FIG. 4 is a schematic of a die of a SSD controller in accordance with some embodiments of the disclosed subject matter.

In some embodiments, the IO pads can be arranged in multiple layers around at least two sides of the perimeter. FIG. 4 is a schematic of a die corresponding to an SSD controller in accordance with some embodiments of the disclosed subject matter. Die 400 is configured to interface with n+1 N-Flash devices. The IO pads are arranged in two layers around more than one side of the perimeter. Die 400 includes a core 410 that includes SSD controller 106, five corners 412, 414, 415, 416, and 418, a plurality of IO pads 420, 422, 424, 426, for n+1 N-Flash devices, and a plurality of additional IO pads 430, 440, 450 and 460 for providing external signals to the core 410. As compared to FIG. 3, the configuration of FIG. 4 can reduce the size of unused area 470 even more. In some embodiments, the multi-layer IO pads can form multiple rings. For example, IO pads 420, 422, 424 form an outer ring, whereas IO pads 426 form an inner ring. Corner pads 412, 414, 416, 18 provide electrical connections around the outer ring, whereas corner pad 415 provides electrical connections around the inner ring. The two-ring IO pad structure around core 410 can reduce unused die area 470 and enable a smaller core die area 480.

FIG. 5A is a schematic of IO pads in a SSD controller in accordance with some embodiments of the disclosed subject matter. Each IO pad 500, 510, 520 can include one or more of the following: a ground node for receiving a ground signal, a VDD input 501, 511, 521, a pin out (PAD), such as a bond pad, to interface with external signals 502, 512, 522, an amplifier 503, 513, 523 to receive a signal from the PAD 502, 512, 522, an internal pin out 505, 515, 525 to the core, and a VSS input. VDD inputs 501, 511, 512 are coupled to the positive supply voltage of the core, and are tied to the same net throughout the IO pad ring. As used herein, a net is a wire in a chip for interconnection between two devices. When two devices need to be connected in a chip, a net is created for the connection. VSS inputs 504, 514, 524 are coupled to the negative supply of the core, and are tied to the same, but separate net throughout the IO pad ring. VDD input and VSS input are received from an external source (e.g., from the printed circuit board to the chip). The dashed line between IO 2 510 and IO n 520 indicates that a plurality of IO pads can be implemented between IO 2 510 and IO n 520. When IO pads are arranged as a circle or a ring, VDDs and VSSs would independently form separate rings.

In some embodiments, the IO pads can include circuitry for electrostatic discharge (ESD) protection. Electrostatic discharge (ESD) protected pads can protect the core circuitry within the die. ESD can arise from a number of reasons and come from various sources. For example, ESD problems can occur when the controllers are used in abnormal operating conditions, being handled inappropriately, or the controllers are designed on poor printed circuit boards. FIG. 5B is a schematic of ESD protected IO pads of a SSD controller in accordance with some embodiments of the disclosed subject matter. IO pads 500, 510, and 520 are identical to the pads shown in FIG. 5A, except that each IO pad also includes a first ESD clamp 506, 516, 526 for the VDD input and a second ESD clamp 507, 517, 527 for the VSS input. Each ESD clamp is also connected to ground. Therefore, when one of the VDD inputs receives a static charge, the first ESD clamps will discharge the received static charge to protect the chip. Likewise, when one of the VSS inputs receives a static charge, the second ESD clamps will discharge the received charge.

Figure 6A:
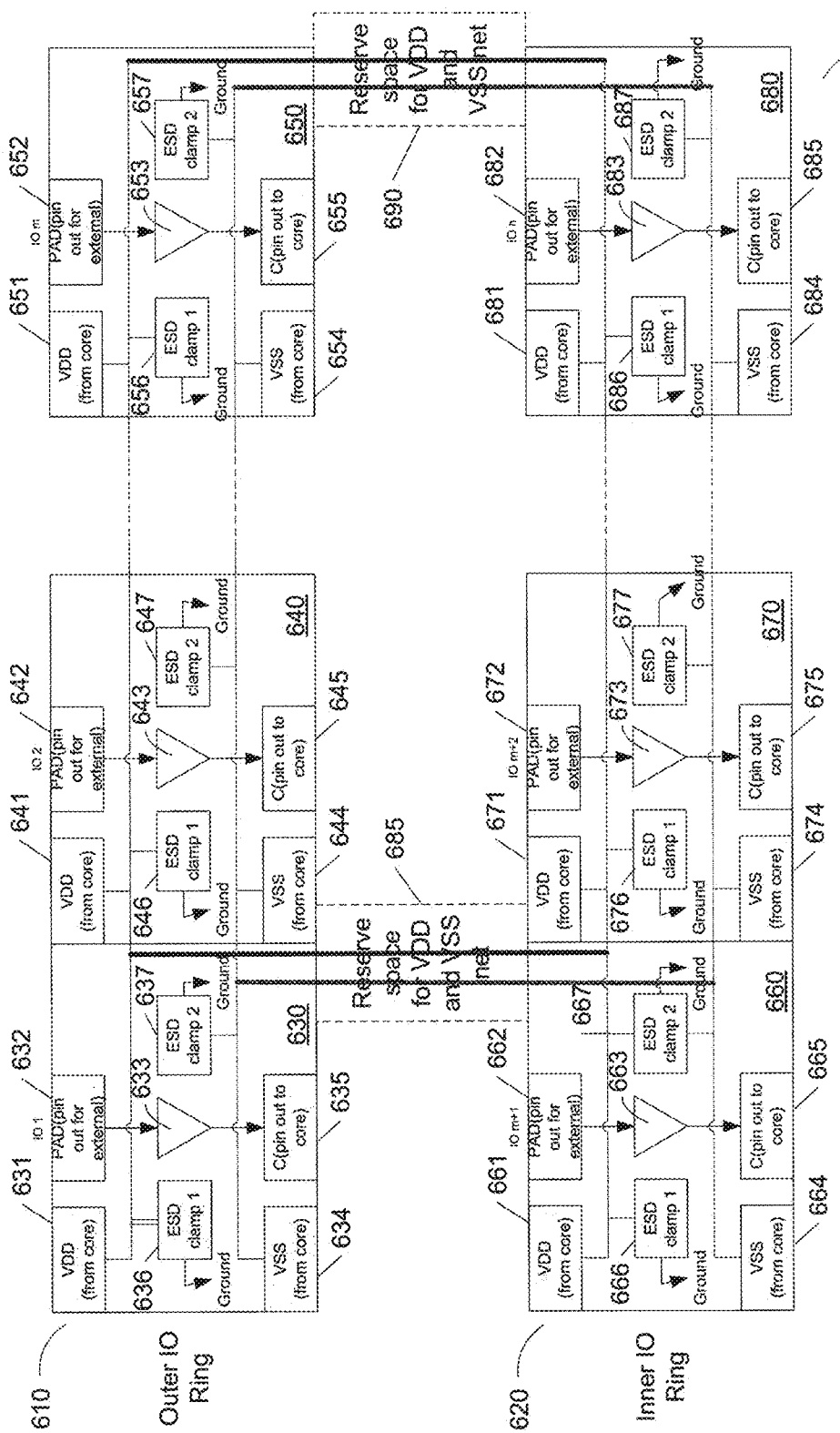
FIGS. 6A-6B illustrate schematics of two IO pad rings with an electrostatic discharge protection in accordance with some embodiments of the disclosed subject matter.

In some embodiments, IO pad rings can share power domains. In such embodiments, if the IO pads also include ESD clamps, the IO pads can also share the ESD clamps. FIG. 6A is a schematic of two IO pad rings with a ESD protection in accordance with some embodiments of the disclosed subject matter. The outer IO ring 610 includes IO pads 630, 640, 650. The dashed line between IO pad 640 and IO pad 650 indicates that a plurality of IO pads can be implemented between IO pad 640 and IO pad 650. Inner IO ring 620 includes IO pads 660, 670, 680. The dashed line between IO pad 670 and IO pad 680 indicates that a plurality of IO pads can be implemented between IO pad 670 and IO pad 680. Each IO pad can include one or more of the following: a ground node for receiving a ground signal, a VDD input coupled to core 631, 641, 651, 661, 671, 681; a pin out (PAD), such as a bond pad, for interfacing with external devices 632, 642, 652, 662, 672, 682; an amplifier 633, 643, 653, 663, 673, 683 to receive a signal from the PAD 632, 642, 652, 662, 672, 682 and a pin out to core (C) 635, 645, 655, 665, 675, 685; a VSS input from core 634, 644, 654, 664, 674, 684; a first ESD clamp 636, 646, 656, 666, 676, 686 connected to ground and VDD input; and a second ESD clamp 637, 647, 657, 667, 677, 687 connected to ground and VSS input.

The power domains VDD and VSS for the IO rings can be coupled to one another. This way, all IOs 630, 640, 650, 660, 670, 680 are electrically connected through each of their respective VDD inputs 631, 641, 651, 661, 671, 681 and VSS inputs 634, 644, 654, 664, 674, 684.

Because the voltage swings in the core is smaller than the voltage level of external power source (VDD and VSS), the VDD and VSS connections between the rings may inject noise to the voltage signals in the core. To prevent the noise injection, it may be desirable to dedicate a bit of die area to couple the VDD and VSS, as illustrated as 685 and 690, to prevent noise injection from the power domain VDD and VSS.

The sharing of the power domains between two IO rings can be useful for ESD protection. When one of the VDD inputs receives a static charge, this configuration provides "n" number of ESD discharge paths to protect the core. Since it is preferable to have as many discharging paths as possible for the ESD event, the sharing of the power domains results in a ESD protection circuitry that is as strong as a single-ring IO arrangement.

Figure 6B:
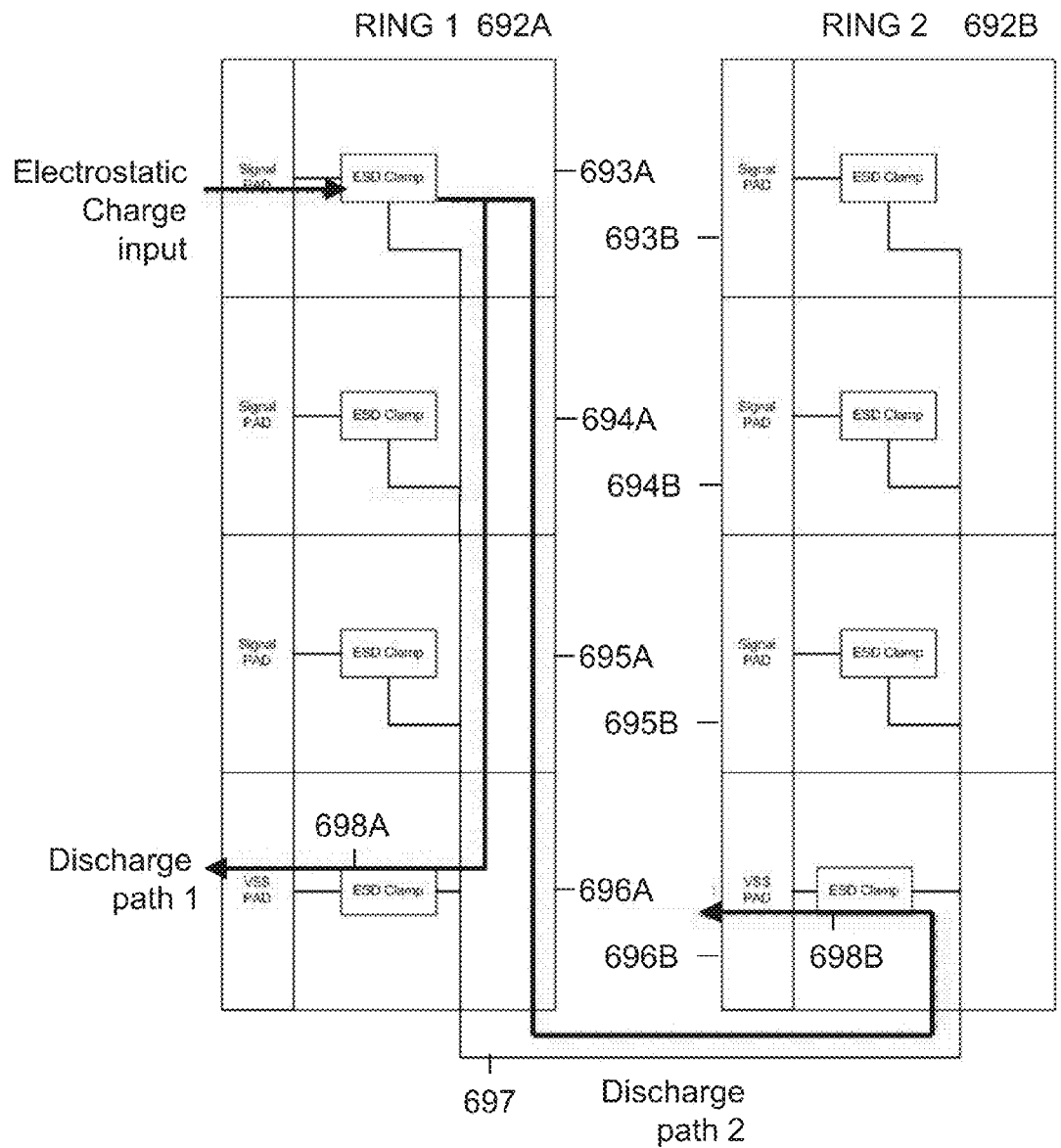

FIG. 6B illustrates a configuration in which the power domains between two IO rings are electrically coupled to strengthen the ESD protection circuitry in accordance with some embodiments of the disclosed subject matter. FIG. 6B shows two IO rings 692A, 692B, each having a single ESD path. The first IO ring 692A includes IO pads 693A, 694A, 695A, 696A; the second IO ring 692B includes IO pads 693B, 694B, 695B, 696B. The IO rings 692A-692B share the power domains, including the VSS line 698, which strengthens the ESD protection. For example, even though each ring only has a single discharge path, electrostatic charge can be discharged through two paths, one discharge path 698A in IO ring 1 692A and another discharge path 698B in IO ring 2 692B.

In some embodiments, each IO ring can maintain its own power domain. For example, the VDD inputs and the VSS inputs in the IO pads can be coupled together when the IO pads belong to the same ring, whereas the VDD inputs and the VSS inputs can be decoupled when the IO pads belong to different rings.

Figure 7:
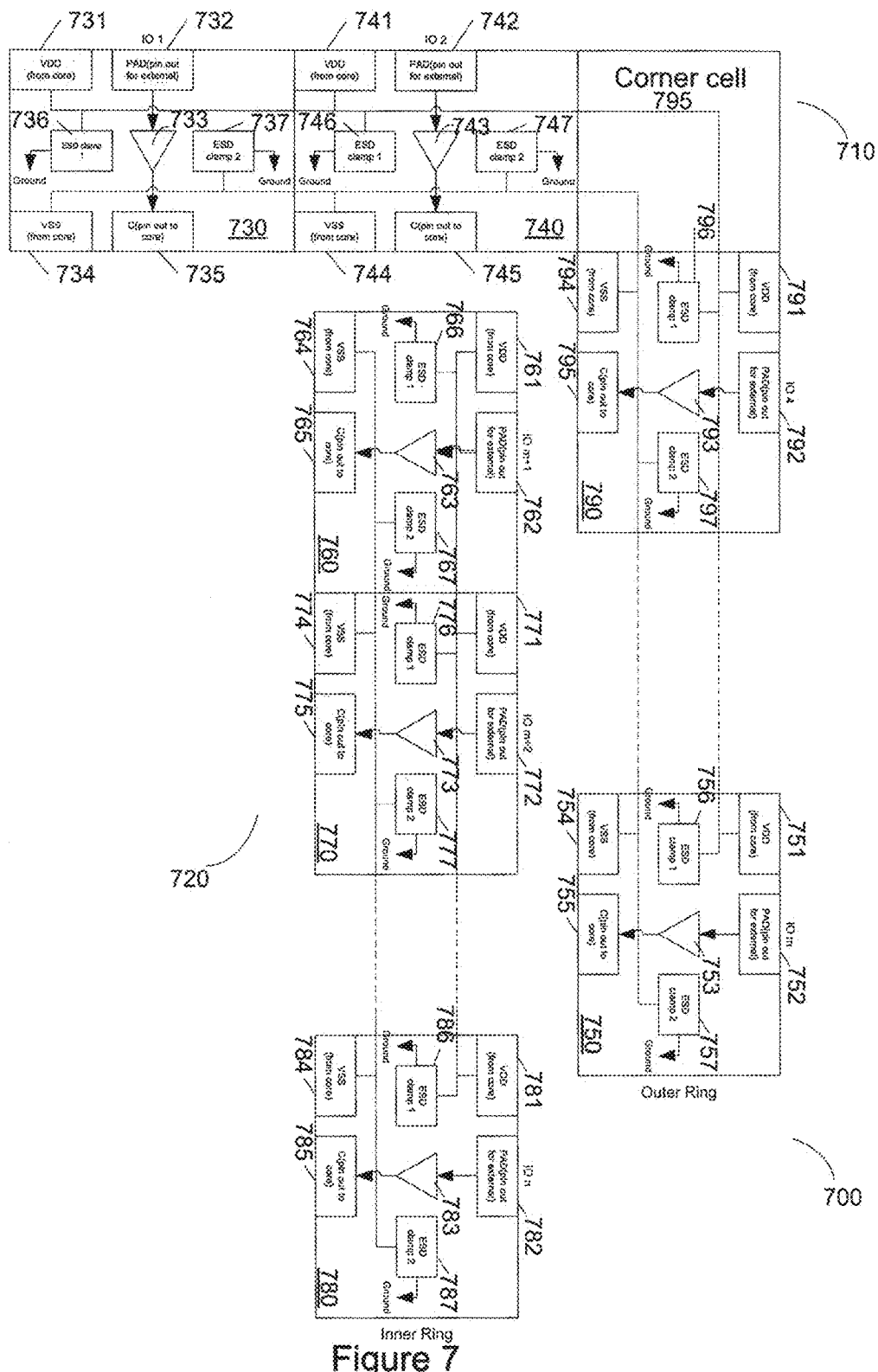
FIG. 7 illustrates an IO pad structure having two rings, in which each ring has an independent electrostatic discharge protection in accordance with some embodiments of the disclosed subject matter.

FIG. 7 illustrates an IO structure having two rings, in which each ring has an independent ESD protection in accordance with some embodiments of the disclosed subject matter. In contrast to FIG. 6A, outer and inner rings are constructed as independent IO rings with independent power domains. Accordingly, the outer and inner rings are not coupled to one another via a reserved die space. FIG. 7 depicts and IO structure 700 having a first outer IO ring 710 and a second outer IO ring 720. First outer IO ring includes IO pads 730, 740, 750, 790, and a corner cell 795. The dashed line between IO pad 790 and IO pad 750 indicates that a plurality of IO pads can be implemented between IO pad 790 and IO pad 750. Inner IO ring 720 includes IO pads 760, 770, 780. The dashed line between IO pad 760 and IO pad 780 indicates that a plurality of IO pads can be implemented between IO pad 760 and IO pad 780. Each IO pad can include one or more of the following: a ground node for receiving a ground signal, a VDD input 731, 741, 751, 761, 771, 781 for the core, 791; a pin out (PAD), such as a bond pad, for receiving external signals 732, 742, 752, 762, 772, 782, 792, an amplifier 733, 743, 753, 763, 773, 783, 793, a pin out to core (C) 735, 745, 755, 765, 775, 785, 795, a VSS input 734, 744, 754, 764, 774, 784, 794, a first ESD clamp 736, 746, 756, 766, 776, 786, 796 connected to the VDD input and ground; and a second ESD clamp 737, 747, 757, 767, 777, 787, 797 connected to VSS input and ground.

As discussed above, in contrast to FIG. 6A, the IO pads in the inner ring 720 are not electrically connected to the IO pads in the outer ring 710. However, the IOs within the outer ring are electrically connected through each of their respective VDD 731, 741, 751, 791 and VSS 734, 744, 754, 794 connections. Likewise, the IOs within the inner ring are connected through each of their respective VDD 761, 771, 781 and VSS 764, 774, 784.

Figure 8:
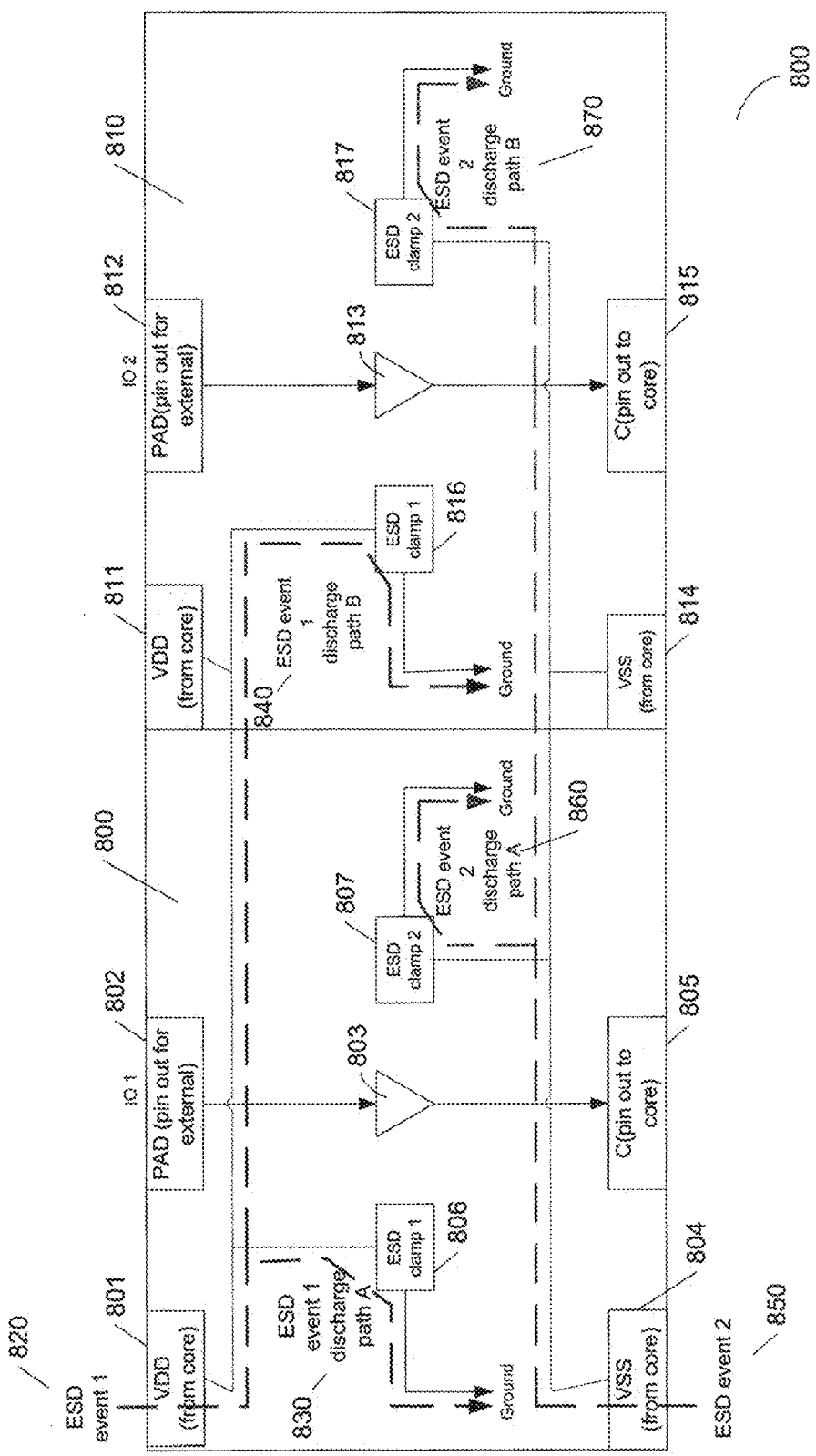
FIG. 8 shows an IO pad structure with an electrostatic discharge protection in accordance with some embodiments of the disclosed subject matter.

In one embodiment, the disclosed configuration improves ESD performance by removing the interconnection of VDD and VSS between the inner and outer IO rings to reduce die size. FIG. 8 is a schematic of IO pads of a multi N-Flash SSD controller with electrostatic discharge protection in accordance with some embodiments of the disclosed subject matter. FIG. 8 is an example of ESD discharging. FIG. 8 depicts two IO pads. Each IO pad 800, 810 can include one of more of the following: a VDD input 801, 811; a pin out (e.g., a bond pad) for external 802, 812; an amplifier 803, 813 to receive a signal from the PAD 802, 812 and transmit it to a pin out to core (C) 805, 815; a VSS input 804, 814; a first ESD clamp 806, 816 connected to the VDD and ground; and a second ESD clamp 807, 817 connected to VSS input and ground.

When a first ESD event 820 is coming from an external source, there are two paths to discharge the ESD energy (ESD event 1 discharge path A 830 and ESD event 1 discharge path B 840). When a second ESD event 850 is coming from external source, there are two paths to discharge ESD energy (ESD event 2 discharge path A 860 and ESD event 2 discharge path B 870). It may be beneficial to calculate how many ESD discharging paths are enough for the individual ESD group, such that there is no crossing between inner and outer rings and die size can be reduced.

Figure 9:
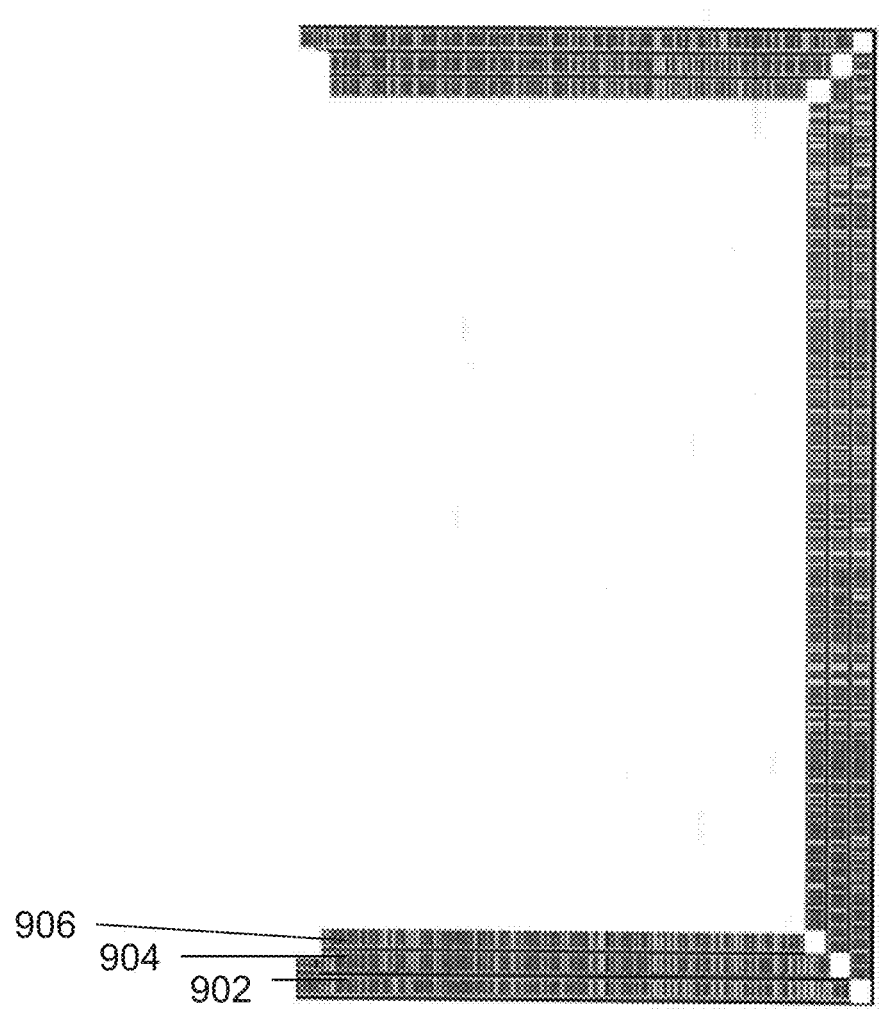
FIG. 9 illustrates a floorplan with a three-ring IO structure in accordance with some embodiments of the disclosed subject matter.

In some embodiments, the die can have more than two IO rings. The die can include any number of IO rings, some of which can maintain shared power domains and some of which can maintain independent power domains. FIG. 9 illustrates a floorplan with a three-ring IO structure in accordance with some embodiments of the disclosed subject matter. FIG. 9 shows the first IO ring 902, the second IO ring 904, and the third IO ring 906.

The disclosed multi-layer IO structure is different from the staggered bond pad technology. In the staggered bond pad technology, the bond pad is staggered, but the IO pad bodies are arranged as a single ring. In contrast, the disclosed multi-ring IO structure arranges the entire IO pad in multiple rings. Therefore, the IO pad bodies, including one or more of the a ground node for receiving a ground signal, the ESD structure, power domain nets, and amplifiers are also arranged in multiple rings.

Those of skill in the art would appreciate that the various illustrations in the specification and drawings described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Headings and subheadings, if any, are used for convenience only and do not limit the disclosed subject matter.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

The terms "SSD," "SSD device," and "SSD drive" as used herein are meant to apply to various configurations of solid state drive devices equipped with SSD controllers and isolation devices in accordance with one or more of the various embodiments of the disclosed subject matter. It will be understood that other types of non-volatile mass storage devices in addition to flash memory devices may also be utilized for mass storage.

I claim:

1. An integrated circuit comprising:
    a first set of input/output (TO) pads arranged as a first pad ring and coupled to a solid state device controller for controlling a plurality of flash memory devices; and
    a second set of IO pads arranged adjacent to at least one side of the first pad ring, wherein one of the second set of IO pads comprises a power source node configured to receive a power supply voltage for the solid state device controller and a ground node.

2. The integrated circuit of claim 1, wherein the second set of IO pads is arranged as a second pad ring concentric with the first pad ring, and wherein an area encompassed by the second pad ring is smaller than an area encompassed by the first pad ring.

3. The integrated circuit of claim 1, wherein at least one of the first set of IO pads comprises a power source node and a ground node.

4. The integrated circuit of claim 3, wherein the ground node in the at least one of the first set of IO pads is electrically coupled to a ground node in another one of the first set of IO pads.

5. The integrated circuit of claim 3, wherein at least one of the second set of IO pads comprises a power source node and a ground node.

6. The integrated circuit of claim 5, wherein the ground node in the at least one of the second set of IO pads is electrically coupled to a ground node in another one of the second set of IO pads.

7. The integrated circuit of claim 5, wherein the ground node in the at least one of the first set of IO pads is electrically coupled to the ground node of the at least one of the second set of IO pads.

8. The integrated circuit of claim 5, wherein:
    one of the first set of IO pads comprises a first electrostatic discharge protection circuit coupled to the power source node and the ground node of the one of the first set of IO pads; and
    one of the second set of IO pads comprises a second electrostatic discharge protection circuit coupled to the power source node and the ground node of the one of the second set of IO pads.

9. The integrated circuit of claim 8, wherein the first electrostatic discharge protection circuit is electrically coupled to the second electrostatic discharge protection circuit.

10. The integrated circuit of claim 8, wherein the first electrostatic discharge protection circuit is electrically decoupled to the second electrostatic discharge protection circuit.

11. The integrated circuit of claim 5, wherein the power source node of the at least one of the first set of IO pads is coupled to the power source node of the at least one of the second set of IO pads using an electrical wire.

12. The integrated circuit of claim 11, wherein a die area physically below the wire is reserved to reduce noise injection into the integrated circuit.

13. A solid state device comprising:
    a plurality of flash memory devices; and
    an integrated circuit comprising:
        a first set of input/output (TO) pads arranged as a first pad ring and coupled to a solid state device controller for controlling the plurality of flash memory devices, and
        a second set of IO pads arranged adjacent to at least one side of the first pad ring, wherein one of the second set of IO pads comprises a power source node configured to receive a power supply voltage for the solid state device controller and a ground node.

14. The solid state device of claim 13, wherein the second set of IO pads is arranged as a second pad ring concentric with the first pad ring, and wherein an area encompassed by the second pad ring is smaller than an area encompassed by the first pad ring.

15. The solid state device of claim 13, wherein one of the first set of IO pads comprises a first electrostatic discharge protection circuit coupled to a power source node and a ground node of one of the first set of IO pads, and wherein the one of the second set of IO pads comprises a second electrostatic discharge protection circuit coupled to the power source node and the ground node of the one of the second set of IO pads.

16. The solid state device of claim 15, wherein the first electrostatic discharge protection circuit is electrically coupled to the second electrostatic discharge protection circuit.

17. The solid state device of claim 15, wherein the first electrostatic discharge protection circuit is electrically decoupled to the second electrostatic discharge protection circuit.

18. An integrated circuit comprising:
    a first set of input/output (TO) pads arranged as a first pad ring; and
    a second set of IO pads arranged adjacent to at least one side of the first pad ring, wherein one of the second set of IO pads comprises a power source node configured to receive a power supply voltage for a circuit block in the integrated circuit.

19. The integrated circuit of claim 18, wherein the second set of IO pads is arranged as a second pad ring concentric with the first pad ring, and wherein an area encompassed by the second pad ring is smaller than an area encompassed by the first pad ring.

20. The integrated circuit of claim 18, wherein one of the first set of IO pads comprises a first electrostatic discharge protection circuit coupled to a power source node and a ground node of the one of the first set of IO pads, and wherein the one of the second set of IO pads comprises a second electrostatic discharge protection circuit coupled to the power source node and the ground node of the one of the second set of TO pads.

* * * * *